(12) United States Patent
Kuriyama et al.

(10) Patent No.: US 6,255,719 B1
(45) Date of Patent: Jul. 3, 2001

(54) SEMICONDUCTOR DEVICE INCLUDING THERMAL NEUTRON ABSORPTION MATERIAL

(75) Inventors: Hirotada Kuriyama; Kazuhito Tsutsumi; Yutaka Arita; Tatsuhiko Akiyama, all of Hyogo; Tadafumi Kishimoto, Osaka, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/201,833

(22) Filed: Dec. 1, 1998

(30) Foreign Application Priority Data

Jun. 5, 1998 (JP) .................................................. 10-157792

(51) Int. Cl.⁷ .......................... H01L 23/552; H01L 23/58
(52) U.S. Cl. .......................... 257/659; 257/660; 257/787; 257/913
(58) Field of Search .................................... 257/659, 660, 257/787, 913

(56) References Cited

U.S. PATENT DOCUMENTS 4,975,762  12/1990  Stradley et al. .

FOREIGN PATENT DOCUMENTS 59-208862  11/1984  (JP) .
1-227460   9/1989   (JP) .
8-330478   12/1996  (JP) .

OTHER PUBLICATIONS

"The effect of sea level cosmic rays on electronic devices", J.F. Ziegler et al., J. Appl. Phys. 52(6), Jun. 1981, pp. 4305–4312.

"Cosmic Ray Neutron Induced Upsets as a Major Contributor to the Soft Error Rate of Current and Future Generation DRAMs", W.R. Mckee et al., IRPS. Proceedings 1996, pp. 1–6, 1996.

"Measurements and Analysis of Neutron–Reaction –Induced Charges in a Silicon Surface Region", Y. Tosaka et al., IEEE Transactions on Nuclear Science, vol. 44, No. 2, 1997, pp. 173–178.

"Boron Compounds as a Dominant Source of Alpha Particles in Semiconductor Devices", R. Baumann et al., IRPS. Proceedings 1995, pp. 297–302, 1995.

"Altitude Variation of Cosmic–Ray Neutrons", T. Nakamura et al., Health Physics, vol. 53, No. 5, Nov. 1987, pp. 509–517.

Glenn F. Knoll, Radiation Detection and Measurement, Second Edition, p. 483, 1989.

Primary Examiner—Minh Loan Tran
(74) Attorney, Agent, or Firm—McDermott, Will & Emery

(57) ABSTRACT

A boron nitride inclusion sheet is applied on the surface of a mold package enclosing a semiconductor chip so as to prevent soft error caused by a thermal neutron.

14 Claims, 4 Drawing Sheets

SEMICONDUCTOR DEVICE INCLUDING THERMAL NEUTRON ABSORPTION MATERIAL

BACKGROUND OF THE INVENTION

1. Field of the Invention

The present invention relates to a semiconductor device capable of preventing a soft error caused by a neutron.

2. Description of the Background Art

Recently, in meetings of academic societies, articles or the like, various reports have been made on a soft error caused by a neutron in a DRAM (Dynamic Random Access Memory) or an SRAM (Static Random Access Memory) formed on a silicon substrate, for example by Ziegler et al. of IBM (International Business Machines Corp.) (J. F. Ziegler et al., *J. Appl. Phys.*, 52(6), 1981, p. 4305), Mckee et al. of TI (Texas Instruments Inc.) (W. R. Mckee et al., *IRPS Proceedings*, 1996, p. 1) and Tosaka et al. of Fujitsu (Y. Tosaka et al. *IEEE Trans. Nuel. Sci.*, Vol. 44, 1997, p. 173).

According to the reports, neutrons in a region with high energy level, specifically neutrons of about several tens of MeV or more react with silicon atoms and generate electric charges by elastic scattering or burst reaction. Then, electrons of the electric charges are collected to a storage node portion, so that the electric charges stored in a memory cell are changed and cell data is destroyed. This is a difficult problem to be solved because a larger number of electric charges are generated by the reaction as compared with a conventional soft error caused by an α-particle.

Meanwhile, it has been predicted by Robert Baumann et al. of Japan TI (R. Baumann et al. *IRPS Proceedings*, 1995, p. 297) that the soft error can be caused by reaction of $^{10}B$ included in a planarizing film before a metal interconnection of a device is formed and thermal neutrons (with energy level of about 0.05 eV) even in a region with neutrons of low energy level. A specific reaction formula is as follows.

$$^{10}B+n \rightarrow \alpha(1.471\ \text{MeV})+Li(839\ \text{KeV})+\gamma(479\ \text{KeV})$$

The α-particle or Li which is generated by the above mentioned reaction reacts with silicon to generate electric charges, whereby data is destroyed at a storage node. It is noted that FIG. 11 is a schematic diagram shown in conjunction with generation of the electric charges caused by the above mentioned two types of reactions. In FIG. 11, a BPSG (Boro-Phospho Silicate Glass) layer 17 is formed on a silicon substrate 16 as a planarizing film including $^{10}B$.

Although two types of the soft errors caused by neutrons have been reported as described above, the actual degrees of neutrons with different energy levels contributing to the soft error have been unknown. Then, the inventors of the present application manufactured two different types of SRAMs, one including $^{10}B$ in a planarizing film and the other without $^{10}B$, and performed two types of experiments in the following.

In the first experiment, $^{252}Cf$ (californium) is used as a source of a neutron, covered with paraffin and converted to a thermal neutron, and directed to the SRAM. At the time, when a soft error ratio of the device including $^{10}B$ exceeds that of the device without $^{10}B$, it is apparent that the soft error is caused by reaction of the thermal neutron and $^{10}B$. As the result of the experiment showed a difference in soft error ratios of thirty times or more, it was found that the soft error is caused by the reaction of the thermal neutron and $^{10}B$.

Next, as a second experiment, the degree of the influence of by thermal neutron on an energy distribution of neutrons in the nature was investigated. More specifically, a neutron acceleration experiment in high altitude flight was performed and contribution of each reaction was evaluated. It has been reported that 100 times or more neutrons exist in high altitude than on the ground (T. Nakamura, 1987, "Altitude Variation of Cosmic-Ray Neutron", *Health Phys.* Vol. 53, p. 509.), so that evaluation can be made in a short period of time and while ignoring a soft error caused by a usual α-particle. The result of the experiment showed that about half of the soft errors caused by neutrons are those caused by thermal neutrons. Thus, the inventors of the present application came to an conclusion that in solving the problem of the soft error, the thermal neutron is as important as the fast neutron which has conventionally been said as cause for soft error.

SUMMARY OF THE INVENTION

The present invention is made to solve the above mentioned problem. It is an object of the present invention to prevent a soft error caused by a thermal neutron.

According to one aspect, a semiconductor device of the present invention is provided with a package and a thermal neutron absorption sheet. In the package, a semiconductor chip internally having a storage element is included. The thermal neutron absorption sheet is applied on the surface of the package and includes a thermal neutron absorption material. Here, the thermal neutron absorption material is a material with a large absorption cross section for a thermal neutron such as $^{10}B$.

By thus applying the thermal neutron absorption sheet on the surface of the package, the thermal neutron absorption material and the thermal neutron can be reacted inside the sheet. Thus, injection of the thermal neutron into the semiconductor chip and generation of electric charges in a silicon substrate can be prevented. In addition, as the thermal neutron absorber is formed in a sheet like shape, a large amount of thermal neutron absorption material can be added and the absorber can be made with a large thickness. This is effective for enhancing performance of absorbing not only a thermal neutron, but also a fast neutron.

The thermal neutron absorption sheet is preferably applied on the surface of the package through an adhesive. The adhesive preferably includes the thermal neutron absorption material.

As the thermal neutron absorption material is thus added to the adhesive, generation of electric charges caused by the thermal neutrons in the silicon substrate can be more effectively prevented.

According to another aspect, a semiconductor device of the present invention is provided with a package and a thermal neutron absorption layer. In the package, a semiconductor chip internally having a storage element is included. The thermal neutron absorption layer is provided inside the package and includes a thermal neutron absorption material.

Even when the thermal neutron absorption layer is thus provided, injection of a thermal neutron into the semiconductor chip can be prevented. Thus generation of electric charges in a silicon substrate is prevented.

According to still another aspect, a semiconductor device of the present invention is provided with a semiconductor chip and an α-particle absorption layer having a thermal neutron absorption portion. The semiconductor chip is internally provided with a storage element. The α-particle absorption layer is formed on the surface of the semiconductor chip, and the thermal neutron absorption portion includes a thermal neutron absorption material.

By thus providing the thermal neutron absorption portion in the α-particle absorption layer, a thermal neutron is reacted inside the α-particle absorption layer to generate an (x-particle or the like. As the energy of the α-particle or the like can be lost inside the α-particle absorption layer, injection of the α-particle or the like into a silicon substrate is prevented. Thus, generation of electric charges in the silicon substrate is prevented.

The α-particle absorption layers are preferably formed on upper and back surfaces of the semiconductor chip.

As a result, injection of the thermal neutron not only from the upper surface but also from the back surface of the semiconductor chip is prevented, so that generation of electric charges in the silicon substrate is effectively prevented.

The α-particle absorption layer preferably has first and second α-particle absorption portions. The first α-particle absorption portion is positioned on the side of the semiconductor chip and does not include the thermal neutron absorption material. The second α-particle absorption portion is formed on the first α-particle absorption portion and includes the thermal neutron absorption material. It is noted that the first and second α-particle absorption portions may be formed in a single layer or in different layers.

By thus providing the second α-particle absorption portion on the first α-particle absorption portion, the thermal neutron is reacted inside the second α-particle absorption portion, and the energy of the resulting α-particle or the like can be damped in the first α-particle absorption portion. Thus, generation of electric charges in the silicon substrate can be effectively prevented.

According to still another aspect, a semiconductor device of the present invention is provided with a package and a heatsink having a thermal neutron absorption portion. In the package, a semiconductor chip internally having a storage element is included. The heatsink protrudes above the surface of the package and the thermal neutron absorption portion includes a thermal neutron absorption material.

Similarly, as a thermal neutron is reacted in the thermal neutron absorption portion, injection of the thermal neutron into the semiconductor chip is prevented. Thus, generation of electric charges in a silicon substrate can be prevented.

The heatsink is preferably mounted on the surface of the package through an adhesive. The thermal neutron absorption portion may include the above mentioned absorption to which the thermal neutron absorption material is added.

When the thermal neutron absorption material is added to the adhesive, injection of the thermal neutron into the semiconductor chip is prevented. In addition, as the adhesive needs only be mixed with the thermal neutron absorption material, operation is facilitated.

The thermal neutron absorption portion includes a thermal neutron absorption layer formed on the surface of the heatsink.

When the thermal neutron absorption layer is thus provided, injection of the thermal neutron into the semiconductor chip can effectively be prevented. Moreover, when a layer with thermal conduction property such as a boron nitride layer is employed as the thermal neutron absorption layer, injection of the thermal neutron is prevented without any decrease in thermal radiation property of the heatsink.

The thermal neutron absorption material may be added to the heatsink. In this case, the thermal neutron absorption portion is at least a part of the heatsink.

Similarly, injection of the thermal neutron into the semiconductor chip can effectively be prevented.

According to still another aspect, a semiconductor device of the present invention is provided with a package and a grease including a thermal neutron absorption material. In the package, a semiconductor chip internally having a storage element is included. The grease is applied on the surface of the package.

When the grease is thus applied on the surface of the package, injection of the thermal neutron into the semiconductor chip can effectively be prevented as in the case described above. In addition, as the grease is employed as a thermal neutron absorber, application operation of the grease is facilitated and the grease can simply be applied over again when it comes off. In addition, the thickness of the grease can readily be changed in accordance with resistance to soft error of the device or the place where the device is used.

According to still another aspect, a semiconductor device of the present invention is provided with a substrate, a casing and a thermal neutron absorption sheet. The substrate includes a semiconductor chip internally having a storage element. The casing encloses the substrate. The thermal neutron absorption sheet is applied on the surface of the casing or to the substrate and includes a thermal neutron absorption material.

By applying the thermal neutron absorption sheet on the surface of the casing which encloses the substrate to which the semiconductor chip is mounted as described above, injection of a thermal neutron into the casing can be prevented. Accordingly, injection of the thermal neutron into the semiconductor chip enclosed in the casing and generation of electric charges by the thermal neutrons in the silicon substrate can be prevented. Further, a similar effect can be obtained also in the case where the thermal neutron absorption sheet is applied on the substrate.

The thermal neutron absorption material preferably includes at least one material selected from boron nitride, lithium and cadmium.

As a material with a large absorption cross section for the thermal neutron such as the above mentioned boron nitride is selected as the thermal neutron absorption material, injection of the thermal neutron into the semiconductor chip can effectively be prevented. When boron nitride is used as the thermal neutron absorption material, in particular, thermal conduction and insulation properties of the layer including boron nitride can be enhanced as boron nitride is provided with excellent thermal conduction and insulation properties.

Preferably, a high neutron absorber is formed on the surface of the semiconductor device to cover the thermal neutron absorber.

In this case, injection of not only the thermal neutron but also the fast neutron into the semiconductor chip can be prevented. The fast neutron loses its energy in the fast neutron absorber to attain the level of the thermal neutron and, subsequently, is reacted with the thermal neutron absorption material in the thermal neutron absorber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to FIGS. 1 to 10.

First Embodiment

First, a first embodiment of the present invention will be described with reference to FIG. 1.

Figure 1:
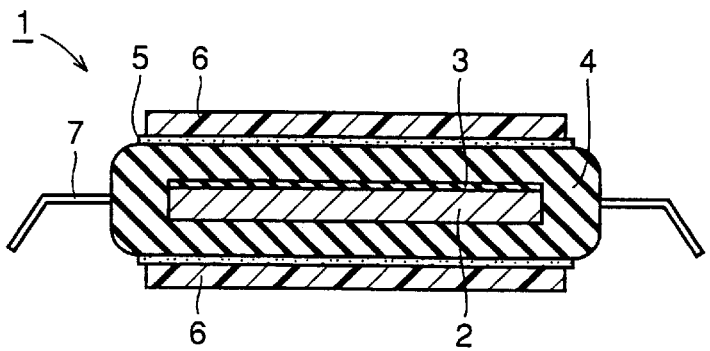
FIG. 1 is a cross sectional view showing a semiconductor device according to a first embodiment of the present invention.

Referring to FIG. 1, a semiconductor device 1 includes a semiconductor chip 2 internally having a storage element, a mold package 4 enclosing semiconductor chip 2, a pin (a lead) 7 and a boron nitride inclusion sheet 6.

A polyimide layer 3 is formed on the surface of semiconductor chip 2. Polyimide layer 3 functions as an α-particle absorption layer. Boron nitride inclusion sheet 6 is applied on the surface of mold package 4 through an adhesive 5.

The inventors of the present application performed an experiment of irradiating a thermal neutron for each of the cases where an IC card is covered with and not covered with a boron nitride inclusion sheet (which is formed from a glass sheet impregnated and coated with silicon resin with boron nitride content of 65%) with a thickness of 0.3 mm. A similar experiment was performed for a cadmium sheet (thickness: 0.5 mm, absorption cross section: $2.08 \times 10^{-20}$ cm$^2$). The result is shown in the following Table 1.

TABLE 1

| Sheet Material | Invalid Bit Number per Sheet | Thermal Neutron Irradiation Time (H) |
| --- | --- | --- |
| Boron Nitride Inclusion Sheet | 24 | 54.5 |
| Cadmium Inclusion Sheet | 4 | 54.5 |
| Without Sheet | 60 | 54.5 |

As shown in Table 1, the invalid bit number can be reduced by employing the boron nitride or cadmium inclusion sheet. In other words, soft error caused by the thermal neutron can effectively be prevented.

This is because the α-particle or Li which is generated by reaction of a thermal neutron absorption material such as $^{10}$B and the thermal neutron in the above mentioned sheet may lose its energy before reaching semiconductor chip 2.

The thickness of boron nitride inclusion sheet 6 will now be described. Assuming that the following BPSG layer is used as a planarizing film in semiconductor chip 2, the thickness required for boron nitride inclusion sheet 6a is calculated from the thickness of the BPSG layer.

If the concentration of B$_2$O$_3$ is 8.0 mol %, the number of atoms n of $^{10}$B (assume that 20% of boron is $^{10}$B) would be $6.3 \times 10^{20}$/cm$^3$. An absorption cross section a of the thermal neutron to $^{10}$B is 3837 barns ($10^{-24}$ cm$^2$). Thus, a reaction probability for the BPSG layer with a thickness of 1 cm is as follows.

$$6.3 \times 10^{20} (/\text{cm}^3) \times 3837 \times 10^{-24} (\text{cm}^2) = 2.4/\text{cm}$$

Assume that the thickness of the BPSG layer to be reacted with the thermal neutron is Zcm and a ratio of neutrons passed through the BPSG layer with the thickness of Zcm is Y, where a relation $Y = e^{-a*n*z}$ exists.

If the reaction probability is to be reduced by one order of magnitude for reduction in soft error, Y=0.1 and thus Z=0.96 cm.

As the BPSG layer is generally formed on the semiconductor chip only with a thickness of at most $1.0 \times 10^{-4}$ cm, a film with a high content of $^{10}$B such as the above mentioned boron-nitride inclusion sheet 6 must be used. More specifically, a film including $6.3 \times 10^{20} \times 2.4 \times 10^{4} = 1.5 \times 10^{25}$ $^{10}$B must be used.

Here, when boron nitride inclusion sheet 6 is used, boron content can be increased to as high as about 65% (not higher than about 10% in the case of the BPSG layer) and the sheet can be formed in a rubber sheet-like shape, so that a thickness in the millimeter order is obtained.

According to the relation with the boron content, the thickness of boron nitride inclusion sheet 6 can be reduced by about one order of magnitude as compared with the case of the BPSG layer. More specifically, a soft error ratio can be reduced by one order of magnitude with a thickness of about 1 mm. It is noted that the thickness or boron content of boron nitride inclusion sheet 6 can be arbitrarily set and increased to obtain enhanced thermal neutron absorption performance.

In addition, as the above mentioned boron nitride inclusion sheet 6 is provided with enhanced heat conduction and electrical insulation properties, heat radiation and electrical insulation properties of semiconductor device 1 can be enhanced.

Further, boron nitride can be added to adhesive 5, which would further enhance the effect of shielding the thermal neutron.

Second Embodiment

A second embodiment of the present invention will now be described with reference to FIG. 2.

Figure 2:
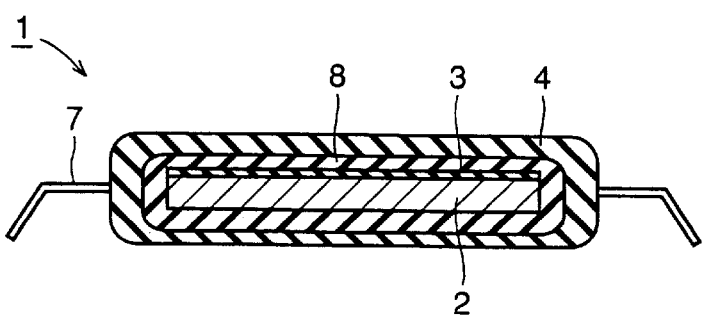
FIG. 2 is a cross sectional view showing a semiconductor device according to a second embodiment of the present invention.

Referring to FIG. 2, in the present embodiment, a boron nitride layer 8 is formed inside a mold package 4. More specifically, a semiconductor chip 2 for which a wafer processing has completed is coated with boron nitride layer 8, which is further coated with mold package 4. Boron nitride layer 8 is formed by coating semiconductor chip 2 with thermosetting resin to which boron nitride is added and then curing the thermosetting resin. Subsequently, mold package 4 is formed in a well-known method.

By forming boron nitride layer 8 as described above, $^{10}$B in the boron nitride layer can be reacted with a thermal neutron. Thus, injection of the thermal neutron into the semiconductor chip can be prevented.

As in the case of the above mentioned boron nitride inclusion sheet 6, the boron content and the thickness of boron nitride layer 8 in the present second embodiment can also be increased. Thus, shielding of the thermal neutron is more effectively be achieved.

In addition, as boron nitride layer 8 is coated with mold package 4, it is protected by mold package 4.

Third Embodiment referring to FIGS. 3 and 4, a third embodiment of the present invention and a modification thereof will be described.

Figure 3:
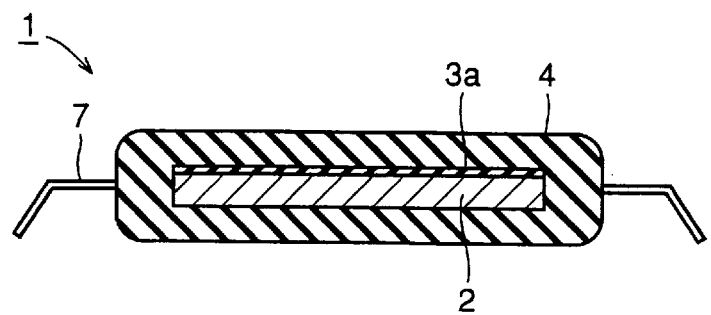
FIG. 3 is a cross sectional view showing a semiconductor device according to a third embodiment of the present invention.
Figure 4:
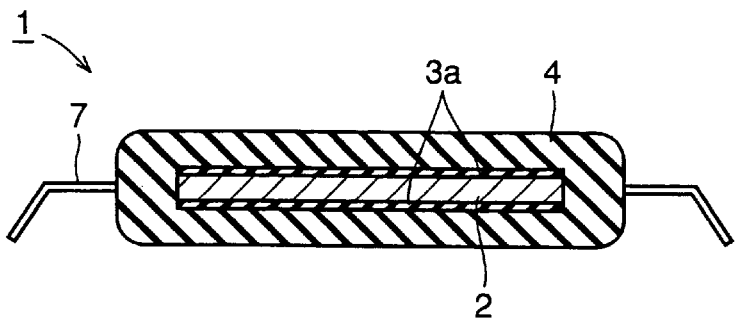
FIG. 4 is a cross sectional view showing a modification of the semiconductor device shown in FIG. 3.

Referring to FIG. 3, in the present third embodiment, a boron nitride inclusion polyimide layer 3a is formed on the surface of a semiconductor chip 2. Boron nitride inclusion polyimide layer 3a prevents a thermal neutron and an α-particle from reaching an interlayer insulation film within the chip and a silicon substrate, respectively.

Now, the modification of semiconductor device 1 shown in FIG. 3 will be described with reference to FIG. 4. As shown in FIG. 4, in the present modification, boron nitride inclusion polyimide layers 3a are formed on upper and lower surfaces of a semiconductor chip 2. Thus, injection of a thermal neutron can be prevented even from the lower surface of semiconductor chip 2, so that soft error can be prevented more effectively. It is noted that boron nitride inclusion polyimide layer 3a may be formed to extend over side surfaces of semiconductor chip 2.

Fourth Embodiment

Figure 5:
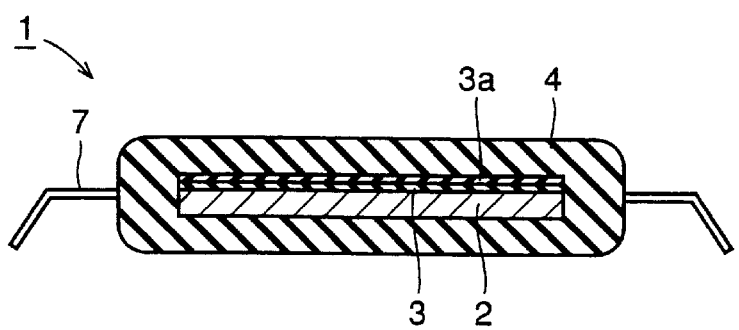
FIG. 5 is a cross sectional view showing a semiconductor device according to a fourth embodiment of the present invention.

A fourth embodiment of the present invention will now be described with reference to FIG. 5. Referring to FIG. 5, in the present fourth embodiment, a boron nitride inclusion polyimide layer 3a is formed on a polyimide layer 3 not including boron nitride. Thus, a thermal neutron is reacted with $^{10}B$ in boron nitride inclusion polyimide layer 3a, and an α-particle and Li generated by the reaction can be damped in polyimide layer 3. As a result, generation of electric charges in a silicon substrate and soft error can be prevented.

It is noted that although boron nitride inclusion polyimide layer 3a and polyimide layer 3 are separate layers in FIG. 5, these may be integrated. In other words, boron nitride may be added only to the surface portion of polyimide layer 3. A similar effect can also be obtained in this case. In addition, polyimide layer 3 and boron nitride inclusion polyimide layer 3a may extend over a side or back surface of semiconductor chip 2.

Fifth Embodiment

A fifth embodiment of the present invention and a modification thereof will now be described with reference to FIGS. 6 and 7.

Figure 6:
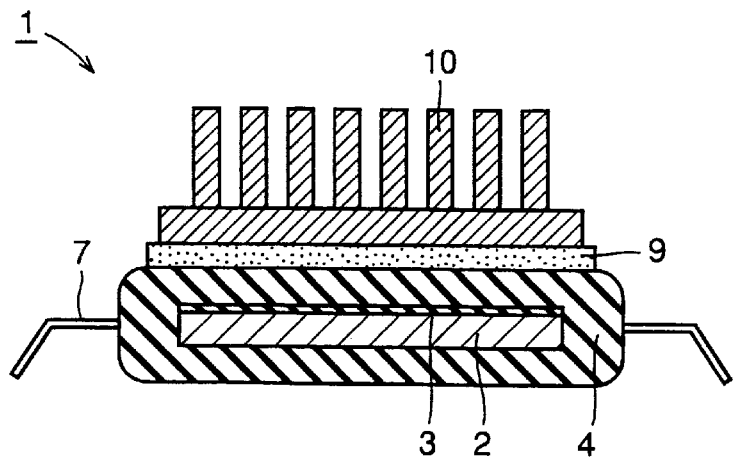
FIG. 6 is a cross sectional view showing a semiconductor device according to a fifth embodiment of the present invention.
Figure 7:
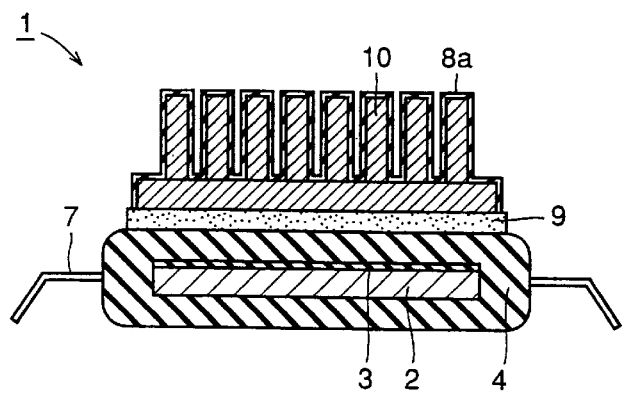
FIG. 7 is a cross sectional view showing a modification of the semiconductor device shown in FIG. 6.

Referring to FIG. 6, in the present fifth embodiment, a semiconductor device 1 is provided with a heatsink 10. Heatsink 10 is mounted on the surface of a mold package 4 through a boron nitride inclusion adhesive 9. By thus employing boron nitride inclusion adhesive 9, a thermal neutron can be shielded as in the above mentioned embodiments.

Now, referring to FIG. 7, the modification of the fifth embodiment will be described. As shown in FIG. 7, in the present modification, a boron nitride layer 8a is formed on the surface of a heatsink 10. Boron nitride layer 8a is for example formed in a similar method as that of the above mentioned second embodiment. The provision of boron nitride layer 8a allows a thermal neutron to be more effectively shielded.

Boron nitride may be added to heatsink 10 per se. In this case, at least a part of heatsink 10 may be used as a thermal neutron absorber, so that the thermal neutron can more effectively be shielded.

Sixth Embodiment

Figure 8:
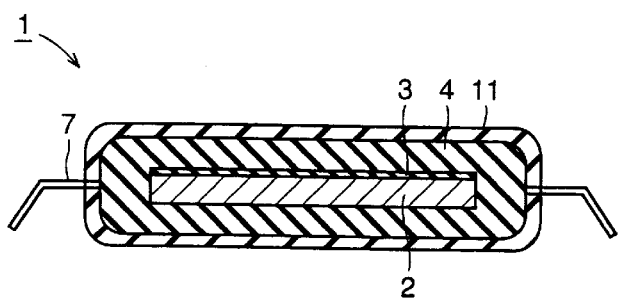
FIG. 8 is a cross sectional view showing a semiconductor device according to a sixth embodiment of the present invention.

A sixth embodiment of the present invention will now be described with reference to FIG. 8. Referring to FIG. 8, in the present sixth embodiment, a boron nitride inclusion grease 11 is applied on the surface of a mold package 4. A thermal neutron can be shielded as in the above mentioned embodiments.

Further, in the present embodiment, the grease may simply applied on the surface of mold package 4, so that operation is facilitated. In addition, a large amount of boron nitride may be added to the grease to readily increase boron nitride content. Even when the grease comes off for some reason, it is simply applied over again. Moreover, the thickness of the grease may readily be changed in accordance with resistance to soft error of a device or the place where it is used.

Seventh Embodiment

Figure 9:
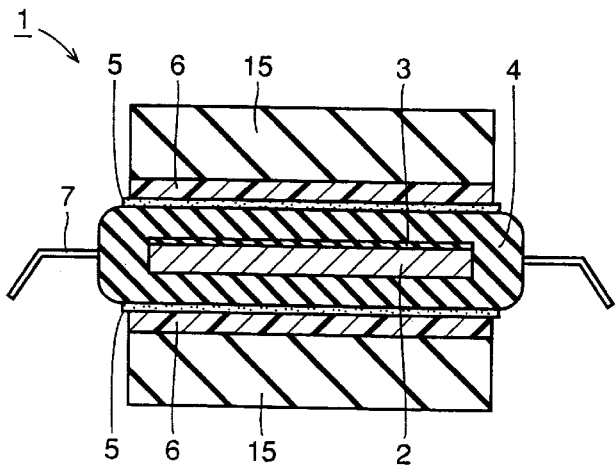
FIG. 9 is a cross sectional view showing a semiconductor device according to a seventh embodiment of the present invention.

A seventh embodiment of the present invention will now be described with reference to FIG. 9. As shown in FIG. 9, in the present embodiment, a fast neutron (a neutron with high energy level) absorber is provided to cover a boron nitride inclusion sheet 6 (a thermal neutron absorber).

More specifically, a paraffin (wax) layer 15 is provided on the surface of boron nitride inclusion sheet 6. The fast neutron loses its energy by collision in passing paraffin layer 15 and ultimately attains the level of a thermal neutron. Then, the thermal neutron is absorbed by boron nitride inclusion sheet 6. Therefore, in the present embodiment, not only thermal neutron but also fast neutron can be shielded.

It is noted that the principle of the seventh embodiment is applicable to the above mentioned first to sixth embodiments and an eighth embodiment which will later be described. Further, any fast neutron absorber other than paraffin layer 15 may be employed as long as it is provided with a function of shielding a fast neutron.

Eighth Embodiment

Figure 10:
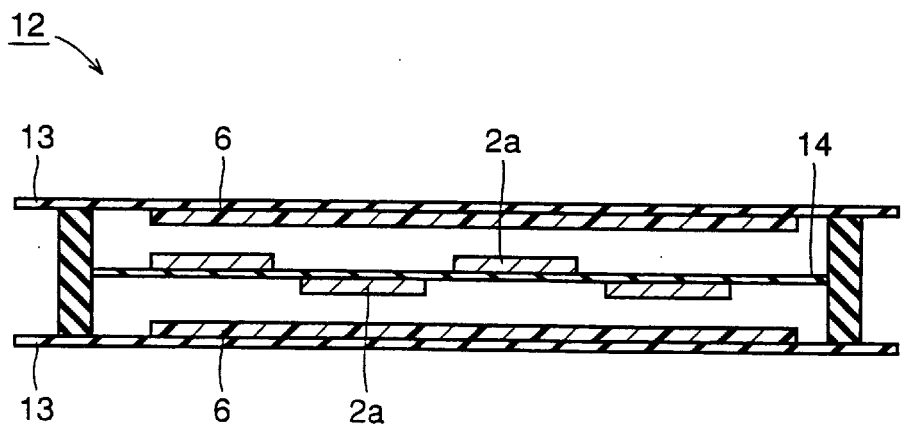
FIG. 10 is a cross sectional view showing a semiconductor device according to an eighth embodiment of the present invention.
Figure 11:
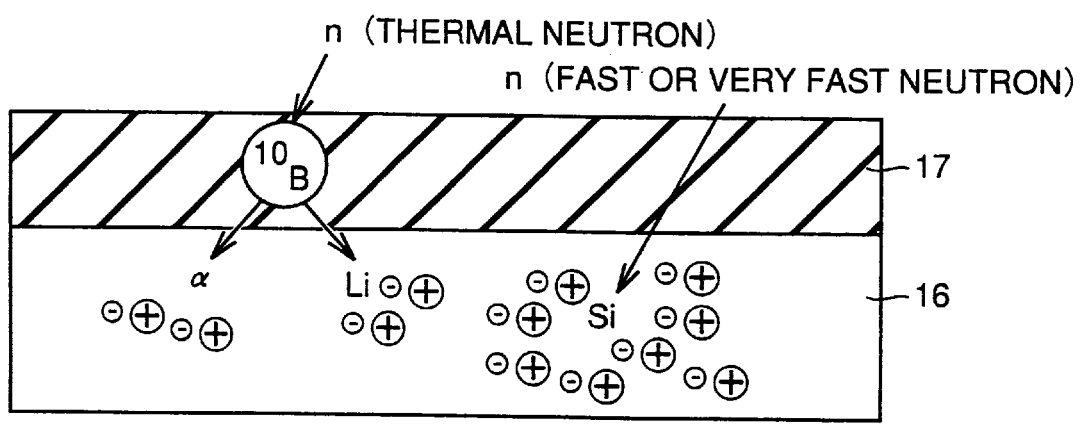
FIG. 11 is a diagram shown in conjunction with reaction of neutrons.

An eighth embodiment of the present invention will now be described with reference to FIG. 10. As shown in FIG. 10, the principle of the invention is also applicable to an IC card.

Referring to FIG. 10, an IC card 12 is provided with a casing 13 and a semiconductor chip 2a which is mounted on a packaged substrate 14 and enclosed in a mold package. Then, a boron nitride inclusion sheet 6 is applied on the surface of casing 13 which encloses packaged substrate 14. A thermal neutron can be shielded as in the above mentioned embodiments.

It is noted that boron nitride inclusion sheet 6 may be applied on the outer surface of casing 13, on the surface of the package or on packaged substrate 14. In addition, a grease may be applied on the inner surface of casing 13.

Although in the above mentioned embodiments devices including boron nitride as the thermal neutron absorber are shown, a material other than boron nitride including $^{10}B$ may be employed. Cadmium (Cd) or lithium (Li) having a large absorption cross section for the thermal neutron may be used rather than boron nitride. Cadmium is preferably used for an IC for space probing. The absorption cross section for lithium is for example described in *Radiation Detection And Measurement* 2nd edition p. 483, FIG. 14-1 by G. F. Knoll. It is disclosed in FIG. 14-1 that the absorption cross section is reduced as the energy level increases from a thermal neutron region (of about 0.03 eV) to a fast neutron region (of about 0.1 MeV). However, the absorption cross section for $^{10}$B or the like is large, and therefore it would also be effective for the neutron in the fast region by increasing the content of $^{10}$B or the like.

Although the embodiments of the present invention have been described, the characteristics thereof may be combined together. It is dearly understood that the same is by way of illustration and example only and is not to be taken by way of limitation, the split and scope of the present invention being limited only by the terms of the appended claims.

As in the foregoing, according to the present invention, as the thermal neutron absorber is provided on the surface of or outside the semiconductor chip, injection of the thermal neutron into the semiconductor chip is prevented. Thus, soft error caused by the thermal neutron is prevented.

What is claimed is:

1. A semiconductor device, comprising
    a mold package enclosing a semiconductor chip internally having a storage element, and
    a thermal neutron absorption sheet applied on a surface of said mold package and including a thermal neutron absorption material.

2. The semiconductor device according to claim 1, wherein
    said thermal neutron absorption sheet is applied on the surface of said mold package through an adhesive, and
    said adhesive includes said thermal neutron absorption material.

3. The semiconductor device according to claim 1, wherein said thermal neutron absorption material includes at least one of materials selected from boron nitride, lithium and cadmium.

4. The semiconductor device according to claim 1, wherein a fast neutron absorber is formed on a surface of said semiconductor device to cover said thermal neutron absorption sheet.

5. A semiconductor device, comprising
    a mold package enclosing a semiconductor chip internally having a storage element, and
    a thermal neutron absorption layer provided inside said mold package and including a thermal neutron absorption material.

6. A semiconductor device, comprising
    a semiconductor chip internally having a storage element, and
    an α-particle absorption layer formed on a surface of said semiconductor chip and having a thermal neutron absorption portion including a thermal neutron absorption material.

7. The semiconductor device according to claim 6, wherein said α-particle absorption layers are formed on upper and back surfaces of said semiconductor chip.

8. The semiconductor device according to claim 6, wherein said α-particle absorption layer is provided with a first α-particle absorption portion positioned on a side of said semiconductor chip and not including said thermal neutron absorption material, and a second α-particle absorption portion formed on said first α-particle absorption portion and including said thermal neutron absorption material.

9. A semiconductor device, comprising
    a package enclosing a semiconductor chip internally having a storage element; and
    a heatsink protruding above a surface of said package and having a thermal neutron absorption portion including a thermal neutron absorption material.

10. The semiconductor device according to claim 9, wherein
    said heatsink is mounted on the surface of said package through an adhesive, and
    said thermal neutron absorption portion is said adhesive with said thermal neutron absorption material added thereto.

11. The semiconductor device according to claim 9, wherein said thermal neutron absorption portion includes a thermal neutron absorption layer formed on a surface of said heatsink.

12. The semiconductor device according to claim 9, wherein said thermal neutron absorption material is added into said heatsink and said thermal neutron absorption portion is at least a part of said heatsink.

13. A semiconductor device, comprising
    a mold package enclosing a semiconductor chip internally having a storage element, and
    a grease applied on a surface of said mold package and including a thermal neutron absorption material.

14. A semiconductor device, comprising
    a substrate provided with a semiconductor chip internally having a storage element,
    a casing enclosing said substrate, and
    a thermal neutron absorption sheet applied on an outer surface of said casing and including a thermal neutron absorption material.

* * * * *